METHOD FOR METALLIZING OPENINGS IN MINIATURE PRINTED CIRCUIT WAFERS

Filed Feb. 13, 1964

INVENTORS
Randall C. Ragan
Clinton E. Maiden
Wolfe, Hubbard, Voit & Osann
Attys.

United States Patent Office 3,357,856

Patented Dec. 12, 1967

3,357,856

METHOD FOR METALLIZING OPENINGS IN MINIATURE PRINTED CIRCUIT WAFERS

Randall C. Ragan, Tarzana, and Clinton E. Maiden, Canoga Park, Calif., assignors to Electra Manufacturing Company, Independence, Kans., a corporation of Missouri Filed Feb. 13, 1964, Ser. No. 344,748
5 Claims. (Cl. 117—212)

ABSTRACT OF THE DISCLOSURE

A method of metallizing notches or openings in miniature printed circuit wafers by depositing a land of the metallizing liquid around the periphery of each opening on the upper surface of the wafer, and then drawing a vacuum directly beneath each opening to draw the metallizing liquid from the land downwardly over the sidewalls of the opening whereby a continuous film of the liquid is uniformly distributed over the sidewalls and the adjacent portion of the wafer surface covered by the land. The liquid coating is then solidified to form a continuous electrically conducted metal film bonded to the sidewalls and the adjacent portion of the wafer surface. In the case of a notch formed in the edge of the wafer, the vacuum orifice is offset from the center of the notch toward the wafer edge, so that the air stream drawn by the vacuum and the resulting flow of metallizing liquid is directed obliquely down through the notch so as to distribute the liquid all the way to the outer edges of the notch.

The present invention relates generally to an improved method and apparatus for metallizing openings, such as holes and notches, in miniature, subminiature, and microminiature printed circuit wafers and the like.

In the manufacture of miniature printed circuits, the nonconductive wafers which form the substrates for the printed circuits are commonly provided with small notches or holes adapted to receive the desired leads to the printed circuit or for making connections from the circuit on one side of the wafer to the circuit on the other side of the wafer. In order to provide conductive paths extending along the side walls of these openings and at least the adjacent portions of the wafer surface, the notches or holes must be "metallized," i.e., a thin film of an electrically conductive metal must be formed on the side walls of the openings and that portion of the printed surface of the wafer immediately adjacent the peripheries of the openings. However, this metallizing method, as practiced in the prior art, has led to a number of technical and economic problems.

Perhaps the most widely practiced and well known metallizing method is the manual brushing method whereby a suitable metallizing liquid, such as "silver paint," is brushed onto the desired surfaces by the use of a small camel's hair brush while the wafer is held in a suitable device and viewed through a magnifier. Although this method requires very little capital investment, it requires that the openings be metallized one at a time and, therefore, is time-consuming and uneconomical.

Another metallizing procedure which has been proposed heretofore involves the use of multiple pins which are mounted so that they can be dipped into a metallizing liquid and then inserted into the openings to be metallized. The pins are only slightly smaller than the openings so that the metallized liquid is transferred to the side walls of the openings. However, this method usually deposits some of the liquid on the outside edges of the wafer, which must be completely clean and clear of impurities so as to prevent the bridging of conductive material between notches. Consequently, the wafer edges must be subsequently ground to remove the deposited metal. This difficulty may be overcome by carefully metering precise amounts of liquid onto the pins, but the equipment required for such an operation is very costly and is still rather slow. Moreover, this method is not readily adaptable to notches of different sizes and shapes, and does not lend itself to a completely uniform coating of metal on all the preferred surfaces.

It is a primary object of the present invention to provide an improved method of metallizing openings in miniature printed circuit wafers and the like at a relatively high production rate and at a relatively low cost. It is a related object to provide such a method which practically eliminates any manual labor. Another related object is to provide such a method which metallizes all the openings in a given wafer simultaneously.

It is a further object of the invention to provide an improved method of metallizing the openings in a miniature printed circuit wafer whereby the metal film is deposited uniformly over the side walls of the openings and those portions of the wafer surface immediately adjacent to the peripheries of the openings. In this connection, it is an object of the invention to provide such a method which deposits substantially the same thickness of film on the corners formed by the side walls and the printed surface of the wafer as on the side walls. Another object is to provide such a method which, in case of notches formed in the edges of the wafer, is capable of depositing metal uniformly all the way to the ends of the notches adjacent the wafer edges without depositing any metal on the wafer edges.

A still further object of the invention is to provide an improved metallizing method which permits extremely accurate control of the distribution of the metal film. More particularly, it is an object of the invention to provide such a method which permits accurate control of the thickness of the film and the exact surface area covered by the film. Still another object is to provide such a method which produces continuous films extending downwardly over the side walls of the wafer openings all the way to the lower surface of the wafer without overlapping onto the lower surface.

It is still another object of the invention to provide such a method which can metallize any number of wafer openings simultaneously with the printing of a circuit pattern on the wafer surface. It is another object to provide such a method which can be carried out simply and economically without the complex and costly machinery required with certain methods of the prior art. Yet another object is to provide such a method which is readily adaptable to the metalliziing of openings of different sizes and shapes.

Other objects and advantages of the invention will become apparent upon reading the following description and appended claims and upon reference to the drawings, in which:

FIGURE 1 is a perspective view of a typical electrically nonconductive wafer having metallized notches made according to the present invention, which wafer is suitable for use as the substrate for a printed circuit or the like.

Figure 4:
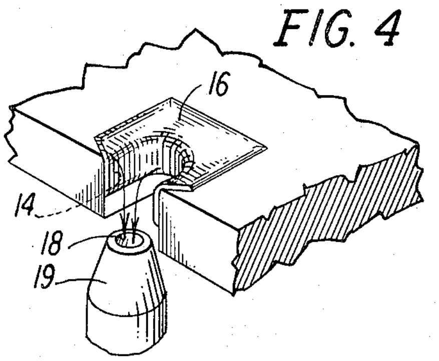
FIG. 4 is an enlarged perspective view of the fragment of FIG. 3 illustrating another step in the subject method.

FIG. *4a* is a plan view of the fragment of FIG. 4.

Figure 3:
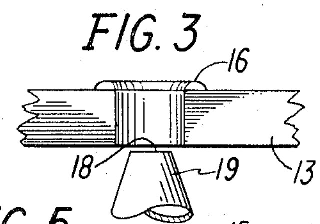
FIG. 3 is an enlarged elevation view of a fragment of the wafer of FIG. 1 illustrating one step of the method of the invention.
Figure 5:
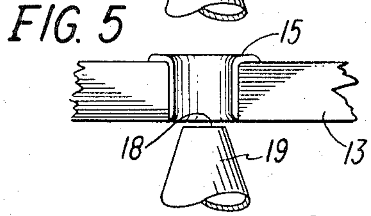

FIG. 5 is an elevation view of the fragment of FIG. 3 showing the final product produced by the subject method.

Figure 6:
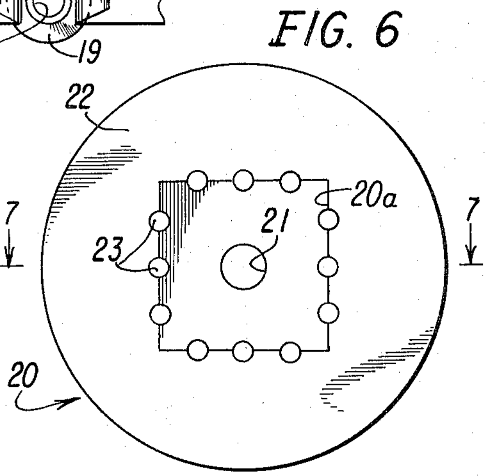

FIG. 6 is a plan view of a table for use in carrying out the method of the invention simultaneously with the printing of a circuit on the wafer surface.

Figure 7:
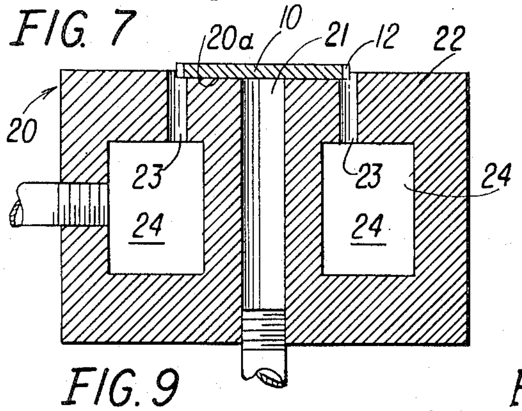

FIG. 7 is a sectional elevation view of the table of FIG. 6 with an electrically nonconductive wafer supported on the top of the table for the metallizing of notches in the edges of the wafer.

Figure 8:
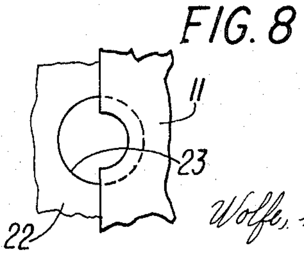

FIG. 8 is a plan view of a fragment of the wafer and table of FIG. 7 showing the position of one of the metallizing vacuum orifices relative to the corresponding wafer notch.

Figure 9:
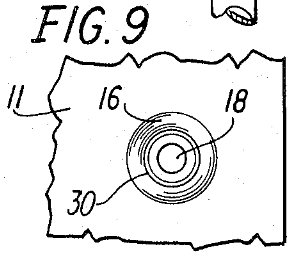

FIG. 9 is a fragmentary plan view of a wafer having a hole rather than a notch for receiving an electrical lead and showing how the method of the invention is applied to such a wafer.

While the invention will be described in connection with a preferred embodiment, it is to be understood that the invention is not to be limited to the disclosed embodiment but, on the contrary, it is intended to cover the various modifications and equivalent arrangements included with the spirit and scope of the appended claims.

Figure 1:
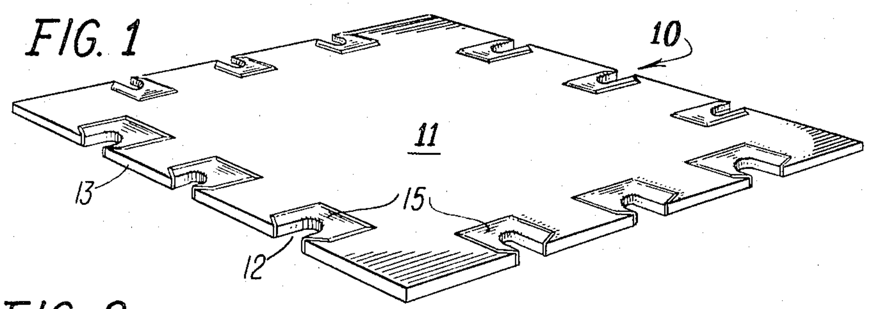

Turning now to the drawings, in FIG. 1 there is illustrated a typical wafer 10 suitable for use as the substrate for a printed circuit, for example of the type employed in a micromodule. The circuit (not shown) is printed on the upper surface 11 of the wafer by any of the well known circuit printing processes, such as silk screening, vacuum evaporation, electrodeposition, cathode sputtering, the application of ordinary printing, engraving, and lithographing techniques and the like. The wafer 10 may be made of any suitable electrically nonconductive substrate material such as, for example, porcelain, glass, steatite, fosterite, and other ceramic materials having the necessary chemical, electrical and physical properties. The wafer must, of course, be capable of withstanding the action of any chemicals used in the circuit printing process and the changes in temperature encountered both during the manufacturing process and during use of the final product. It will be understood that the term "wafer" as used herein is a general term referring to any desired substrate configuration.

For the purpose of receiving suitable leads to the printed circuit formed on the wafer surface 11, a plurality of spaced notches 12 are cut in the edges 13 of the wafer. The particular notches illustrated in the drawing are U-shaped with the open end of the U at the edge of the wafer, but it will be apparent from the ensuing description that the invention is equally applicable to notches of practically any other desired configuration. The notches 12 form a plurality of notch side walls 14 which form corners **14*a* with the top and bottom surfaces of the wafer and corners 14*b* with the wafer edges 13** (see FIG. 2).

In order to provide electrically conductive paths extending along the side walls of the notches and across the adjacent portions of the wafer surface to the printed circuit formed on the wafer surface 11, the notches 12 are metallized with an electrically conductive metal film 15. The film 15 is preferably composed of silver or a gold-platinum composition, but any other suitable electrically conductive metal may be employed. As shown most clearly in FIGS. 1 and 5, the metal film 15 not only covers the notch side walls 14, but also covers a portion of the wafer surface 11 immediately adjacent the upper periphery of each notch 12 so as to bridge any gaps between the edge of the notch and the printed circuit.

In the practice of the present invention, the conductive metal film is formed around the notches or other openings in the wafer by depositing a land of metallizing liquid around the periphery of each opening on the main surface of the water, effecting a velocious flow of air or other fluid across the surface of the land and down through the opening so as to distribute the liquid over the side walls of the opening and that portion of the wafer surface covered by the land, and then solidifying the distributed liquid. Thus, in the particular embodiment illustrated in the drawing, a small land 16 (see FIG. 3) of metallizing liquid is deposited around the periphery of each notch 12 on the wafer surface 11. The lands 16 are preferably tapered inwardly away from the wafer edges, as at **16*a***, to insure that the liquid does not run down over the wafer edge. As used herein, the term "metallizing liquid" refers to molten metal, metal solutions, dispersions, suspensions, or any other metal-containing substance which can be made to flow over a solid surface so as to distribute the metal thereover. For example, a "silver paint" such as #7095 made by the Electrochemicals Division of E. I. du Pont de Nemours & Co., Inc. is a suitable metallizing liquid.

The metal need not be in its elemental form in the liquid substance, as long as it can be converted to the elemental form after it has been distributed over the desired area. Also, the metal must be electrically conductive and must be capable of being bonded to the nonconductive wafer upon solidification of the liquid material. The term "solidification" includes not only the freezing of molten metal, but also any other treatment of the liquid material which results in a solid metal film bonded to the wafer. Thus, it may be necessary to heat the liquid material to decompose a metal compound and to drive off certain solvents and binders included therein so as to solidify a metal film on the wafer surface. Examples of such thermally decomposable metal compounds are metal resinates and abietates, such as liquid bright gold #6846 made by the Electrochemicals Division of E. I. du Pont de Nemours & Co., Inc.

As will be apparent from the ensuing description, if the particular metallizing liquid employed in the method of the invention contains a solvent or other liquid vehicle, the liquid must not be so volatile that its high evaporation rate freezes the material before it can be distributed over the desired area.

Figure 2:
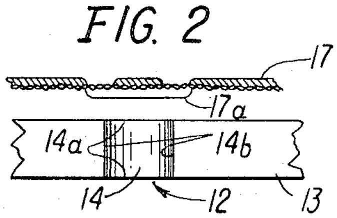
FIG. 2 is a side elevation of a fragment of a nonconductive wafer having a notch to be metallized and showing a screen above the wafer for depositing or printing the metallizing liquid onto the desired areas of the wafer.

In order to achieve a high production rate, it is preferred to deposit all the liquid lands 16 on a single wafer simultaneously. This may be readily accomplished by a number of different stencilling methods, such as silk screening for example. Thus, as illustrated in FIG. 2, a stencilled silk screen 17 provided with a charge of metallizing liquid **17*a* may be lowered onto the upper surface of the wafer to deposit or print the desired lands 16. After the liquid lands 16 have been deposited, the metallizing liquid is distributed uniformly over the side walls 14 of the notches by producing a pressure differential across the thickness of the wafer in the vicinity of each wafer so as to effect a velocious flow of air across the surface of each land 16 and down through each notch 12. As illustrated in FIGS. 3–5, this pressure differential is preferably produced by drawing a vacuum through an orifice 18 of a vacuum nozzle 19 positioned directly beneath each notch. It has been unexpectedly found that the application of a vacuum in this manner does not merely draw metallizing liquid from that portion of the land 16 nearest the corner 14*a* down into the notch 12, but also causes a velocious flow of air across the surface of the land and down through the notch so as to draw liquid uniformly from the entire land. Indeed, close study of this phenomenon under the microscope has shown that even the material in that portion of the land 16 farthest removed from the notch 12 moves strongly in the direction of the notch during application of the vacuum. Consequently a substantially uniform thickness is maintained across the land, rather than depleting that portion of the land nearest the notch. Moreover, because the present method can be carried out entirely from beneath the wafer after the metallizing liquid has been initially deposited in the form of the lands 16, the production rate can be further increased by metallizing the notches simultaneously with the printing of a circuit on the wafer surface 11**.

Another surprising effect of the present invention is that the resulting film 15 produced by the air stream has a fairly uniform thickness not only over the notch side walls 14 and that portion of the wafer surface 11 covered by the land 16, but also on the corner 14a at the upper periphery of the notch. Although this feature of the invention is not completely understood, it is believed that the relatively high velocity of the air current at the corner 14a increases the drying effect of the air on the metallizing liquid at that point. This tends to gradually solidify the metallizing liquid at that point while the drawing operation is still in progress, thereby preventing all the liquid on the corner 14a from being drawn down into the notch.

In order to control the rate of distribution of the metallizing liquid from the land 16 over the side walls 14 of the notches, any of a number of interdependent variables may be adjusted to produce the desired result. Thus, the distribution rate depends mainly on the viscosity of the metallizing liquid and the velocity of the air stream which, in turn, depends on the strength of the vacuum applied, the size of the vacuum nozzle orifice and the notch opening, and the position of the vacuum orifice relative to the notch. The air velocity should be sufficiently high to distribute the metallizing liquid at a rate consistent with high production rates, but not to high as to cause ripples or waves in the surface of the liquid. In the case of a typical wafer of the type used in micromodules, for example, having a thickness of about 0.010 inch and U-shaped notches about 0.010 to 0.10 inch wide, the distribution of a conventional metallizing liquid having the consistency of honey may be completed by drawing a vacuum of about 20 to 30 inches of mercury through a 0.050 inch diameter vacuum orifice positioned within about 0.020 inch of the lower surface of the wafer for about 1.5 seconds.

By controlling the duration of the drawing period, it is possible to use the method of this invention to form a uniform film over practically any predetermined portion of the notch side walls. For example, if it were desired to coat only the upper half of each notch, the vacuum would be continued only long enough to draw the metallizing liquid halfway down the side walls. Moreover, it should be noted that by proper positioning of the vacuum orifice relative to the notch, the metallizing liquid can be advanced to substantially the same extent around the entire side wall.

Similarly, by controlling the amount of metallizing liquid initially deposited, in relation to the surface area to be coated, the subject method also permits accurate control of the film thickness. In other words, the amount of liquid material deposited must be sufficient to form a film of the desired thickness over the side walls of the opening and the adjacent portion of the wafer covered by the initially deposited liquid. It will be appreciated that this method is capable of producing films of substantially uniform thickness on a continuous basis, even over a relatively large number of wafers.

In accordance with one aspect of this invention, the fluid stream is drawn inwardly away from the notch side walls at the bottom of the notch so as to prevent the metallizing liquid from being scattered in all directions across the lower surface of the wafer, such as occurs when a vacuum is applied across the entire lower surface of the wafer. Thus, in the embodiment of FIGS. 3 to 5, the air stream is drawn into a vacuum orifice 18 which is positioned entirely within the downwardly projected periphery of the notch 14 so as to prevent the metallizing liquid from wrapping around the lower surface of the wafer. Of course, it will be apparent that the vacuum orifice may extend beyond the edge 13 of the wafer from the open end of the U-shaped notch 14, as long as it does not overlap the side walls of the notch as projected laterally outwardly from the edge of the notch.

Figure 4A:
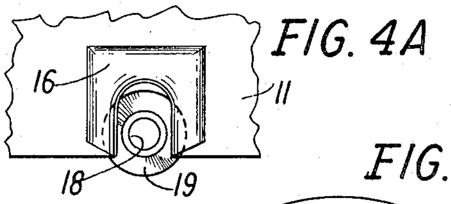

In still another aspect of the invention, the metallizing liquid is distributed continuously and uniformly all the way to the outer corners 14b of the notch side walls 14, without running over onto the wafer edges 13, by offsetting the vacuum orifice from the center of the notch toward the wafer edge, i.e., toward the open end of the U as shown in FIG. 4a. In other words, the metallizing liquid is made to flow obliquely down over the notch side walls toward the wafer edge. This is especially important when one considers the fact that product specifications often require that the wafer notches be metallized to within 0.005 inch or less of the wafer edges which could not be achieved by drawing all the air to the center of the notch. Moreover, since the vacuum prevents the metallizing liquid from running over onto the wafer edges 13, there is no need for subsequent grinding of the wafer edges to render them suitable for soldering and the like.

It will be appreciated that the method of this invention readily permits all the notches 14 to be metallized simultaneously. Thus, as illustrated in FIGS. 6–8, the wafer 10 can be placed on a table 20 having an upper recess 20a adapted to receive the wafer 10, and a central passageway 21 extending therethrough and connected to a first vacuum pump for holding the wafer 10 firmly to the top surface 22 of the table. The upper portion of the table is also provided with a series of twelve smaller passageways 23 arranged to fit under the appropriate portions of the twelve notches 12 in the wafer 10.

For the purpose of drawing the metallizing liquid obliquely down over the notch side walls toward the wafer edge, the centers of the passageways 23 are offset from the centers of the notches 14 so that a major portion of the orifice of each passageway 23 extends beyond the wafer edge, as shown in FIG. 8. Although in the particular embodiment illustrated the vacuum orifices overlap the projected side walls of the notches, it will be understood that the vacuum drawing period may be adjusted to prevent the metallizing liquid from being deposited on the lower surface of the wafer. Each of the twelve passageways 23 leads into an annular plenum chamber 24 which is connected to a second vacuum pump for drawing metallizing liquid down into the notches 12.

In operation, the wafer 10 is held down by the vacuum applied to passageway 21 while both the printed circuit and the liquid lands 16 are applied simultaneously to the upper surface of the wafer. For example, the required depositions could all be made by a single silk screening operation, as illustrated in FIG. 2. After the deposition has been completed, the notches are rapidly metallized by the vacuum applied to the pasageways 23. Both vacuum lines are then shut off, and the wafer is removed for drying or other suitable treatment to solidify the liquid metal. For example, in cases where silver paint is used both for the printed circuit and the metallizing of the notches, the wafer is heated to remove the binder and solvents and to bond the silver to the wafer.

In cases where it is desired to practice the method of the invention without the use of a vacuum, a pressurized stream of air or other fluid is directed down through the opening to be metallized. However, it is still important that the fluid current be directed across the surfaces of the lands 16 before passing down through the opening. Thus, in one embodiment of such a method, a first stream of air is directed horizontally across the surface of the liquid land toward the center of the opening, while a second stream of air is directed vertically downward through the opening. Then as the first stream of air reaches the edge of the opening, it is directed downwardly through the opening by the second stream, thereby producing substantially the same effect as the vacuum technique described above.

While various specific forms of the present invention have been illustrated and described herein in some detail, it will be understood that the same are susceptible of numerous modifications within the spirit and scope of the invention. For example, although the invention has been described with particular reference to the metallizing of notches formed in the edges of the wafer, the method of the invention may also be used to metallize the inside walls of holes formed within the main body of the wafer. i.e., holes which are not open on the edges of the wafer, such as the holes 30 shown in FIG. 9. Moreover, while the wafer notches have been described as forming side walls which are normal to the plane of the wafer, it will be recognized that the invention is equaly applicable to notches which form tapered inside surfaces. It will also be apparent that the method of the invention may be used to metalize the second side of the wafer by simply turning the wafer over and repeating the method as described for the first side. Of course, if only a single thickness of metal is desired on the side walls of the opening, the metal film should be drawn only halfway down the side walls from each surface of the wafer. Finally, while particular reference has been made to the use of a velocious stream of air to distribute the metallizing liquid, it will be recognized that the same effect can be achieved by the use of other fluids, both gas and liquid. For example, some other fluid medium such as nitrogen or the like would be especially desirable in cases where it is desired to avoid an oxidizing atmosphere.

What is claimed is:

1. A method of forming films of electrically conductive metal around openings in miniature printed circuit wafers and the like, which method comprises disposing the wafer in a substantially horizontal position, depositing a land of a metallizing liquid around the periphery of each opening on the upper surface of the wafer, the metal in said liquid being electrically conductive and capable of being bonded to said wafer upon the solidification of said liquid, drawing a vacuum directly beneath each opening to effect a velocious flow of fluid across the surface of each liquid land and down through the corresponding opening so as to draw the metallizing liquid downwardly over the side walls of the opening whereby a continuous film of said liquid is uniformly distributed over said side walls and the adjacent portion of the wafer surface covered by said land, and solidifying the distributed metallizing liquid so as to form a continuous electrically conductive metal film bonded to said side walls and said adjacent portion of the wafer surface.

2. A method of forming a film of electrically conductive metal around a plurality of openings in an electrically nonconductive miniature printed circuit wafer or the like, which method comprises the steps of disposing the wafer in a substantially horizontal position, depositing a land of a metallizing liquid around the periphery of each of said openings on the upper surface of the nonconductive wafer, the metal component of said liquid being electrically conductive and capabe of being bonded to said wafer upon the solidification of said liquid, drawing a vacuum through a plurality of orifices positioned directly beneath said openings, said vacuum effecting a velocious flow of air across the surface of each liquid land and down through the corresponding openings into said orifices so as to draw the metallizing liquid downwardly over the side walls of the openings whereby a continuous film of the metallizing liquid is distributed over said side walls and the adjacent portions of the wafer surface covered by the liquid lines, said vacuum orifices being positioned to draw said air inwardly away from said side walls at the bottoms of said openings so as to prevent the deposition of any of the metallizing liquid on the lower surface of the wafer, and solidifying the distributed metallizing liquid so as to form a continuous electrically conductive metal film bonded to said side walls and said adjacent portions of the wafer surface.

3. The method of claim 2 wherein said openings are notches formed in the edeges of the nonconductive wafer and each of said vacuum orifices is offset from the center of the corresponding notch toward the wafer edge, whereby the velocious stream of air flows obliquely down through the notch so as to distribute the liquid material all the way to the outer edges of the notch.

4. A method of forming a film of electrically conductive metal around a plurality of notches in the edges of an electrically nonconductive miniature printed circuit wafer or the like, which method comprises the steps of disposing the wafer in a substantially horizontal position with the notches extending vertically through the wafer edges, depositing a land of a metallizing liquid around the periphery of each of said notches on the upper surface of the nonconductive wafer, said metal being electrically conductive and capable of being bonded to said wafer upon the solidification of said liquid, drawing a vacuum directly beneath each of said notches so as to draw a velocious stream of air across the surface of each liquid land and obliquely down through each corresponding notch toward the edge of said wafer whereby said liquid is drawn downwardly over the side walls of each notch to form a continuous film of said liquid extending uniformly to the outer edge of each notch, said air stream being drawn inwardly away from the notch side walls at the bottom of each notch so as to prevent the deposition of the liquid on the lower surface of said wafer, and solidifying the distributed metallizing liquid so as to form a continuous electrically conductive metal film bonded to the side walls of the notches and the adjacent portions of the wafer surface covered by the liquid lands.

5. A method of forming films of electrically conductive metal on miniature printed circuit wafers and the like having openings therethrough, which method comprises the steps of disposing the wafer in a substantially horizontal position, printing an electrically conductive film in the form of a predetermined circuit pattern on the upper surface of the nonconductive wafer while simultaneously depositing a land of a metallizing liquid around the periphery of each opening on the printed surface of the wafer, the metal component of said liquid being electrically conductive and capable of being bonded to said wafer upon the solidification of said metallizing liquid, drawing a vacuum directly beneath each opening to effect a velocious flow of fluid across the surface of each liquid land and down through the corresponding openings so as to draw the metallizing liquid downwardly over the side walls of the opening whereby a continuous film of said liquid is uniformly distributed over said side walls and the adjacent portion of the wafer surface covered by said land, and solidifying said printed circuit and said continuous films of metallizing liquid so as to form a uniform electrically conductive metal film bonded to the side walls of each opening and extending across the wafer surface to make electrical contact with said printed circuit.

References Cited

UNITED STATES PATENTS

| | | | |
|---|---|---|---|
| 764,454 | 7/1904 | Giles | 117—98 |
| 2,897,409 | 7/1959 | Gitto | 117—212 X |
| 3,158,503 | 11/1964 | Young | 117—95 |
| 3,294,576 | 12/1966 | Geraghty | 117—98 |

WILLIAM L. JARVIS, *Primary Examiner.*